(12) United States Patent
Cayrou et al.

(10) Patent No.: US 6,492,882 B2
(45) Date of Patent: Dec. 10, 2002

(54) RECONFIGURABLE SWITCH MATRIX IN PARTICULAR FOR SPACE APPLICATIONS

(75) Inventors: Jean-Christophe Cayrou, Agen (FR); Sabine Robichez, Toulouse (FR)

(73) Assignee: Alcatel, Paris (FR)

( * ) Notice: Subject to any disclaimer, the term of this patent is extended or adjusted under 35 U.S.C. 154(b) by 56 days.

(21) Appl. No.: 09/737,850

(22) Filed: Dec. 18, 2000

(65) Prior Publication Data

US 2001/0006361 A1 Jul. 5, 2001

(30) Foreign Application Priority Data

Dec. 23, 1999 (FR) .............................. 99 16334

(51) Int. Cl.[7] .................................. H01P 1/10
(52) U.S. Cl. ...................... 333/101; 333/103
(58) Field of Search .................... 333/11, 103

(56) References Cited

U.S. PATENT DOCUMENTS 4,399,439 A * 8/1983 Upadhyayula ......... 340/825.91
4,472,691 A * 9/1984 Kumar et al. ............... 333/103
5,204,836 A    4/1993 Reed
5,878,052 A    3/1999 Kimura

FOREIGN PATENT DOCUMENTS

GB        2 301 947 A1   12/1996

* cited by examiner

*Primary Examiner*—Michael Tokar
*Assistant Examiner*—Anh Q. Tran
(74) *Attorney, Agent, or Firm*—Sughrue Mion, PLLC

(57) ABSTRACT

The invention relates to a switch matrix having n inlets and p outlets, p being greater n. The matrix includes a plurality of switch members each having one inlet and at least two outlets and each enabling a signal applied to the inlet of said member to be transferred to one of the outlets. Each inlet of the matrix being for connection to one out of r outlets. The switch members are of the electronic type and are mounted in such as manner that when switching is performed consisting in modifying a connection from an inlet of the matrix to an outlet thereof, so that said same inlet is connected to another outlet of the matrix, the losses due to the switch members passed through remain substantially the same value. The invention applies to a matrix enabling a faulty electronic element connected to an outlet of the matrix to be replaced by another element connected to another outlet of the matrix.

6 Claims, 1 Drawing Sheet

RECONFIGURABLE SWITCH MATRIX IN PARTICULAR FOR SPACE APPLICATIONS

The invention relates to a reconfigurable switch matrix in particular for space applications.

BACKGROUND OF THE INVENTION

For applications that require high reliability, it is common practice to provide redundant electronic elements so that in the event of one of them breaking down, it can be replaced by an identical element. This problem arises in particular for space applications.

To enable a spare element to replace the element that has broken down, it is necessary to provide switching which is controlled either automatically or remotely.

In general, such switching is provided by a matrix having n inlets and p outlets, where the number p of outlets is greater than the number n of inlets. Each of the inlets delivers a signal to an element connected to a corresponding outlet. Thus, only n out of the p possible outlets are normally active. When the element connected to one of the outlets breaks down, then switching is performed so that the corresponding inlet is connected to an outlet having a replacement element connected thereto.

The switch matrices that have been used in the past make use of mechanical switches.

An electronic type replacement configuration has yet to be developed that offers advantages comparable to those of mechanical switch matrices. Mechanical matrices give rise to negligible attenuation of about 0.15 dB, while electronic switches lead to greater losses or attenuation of about 1.5 dB. The greater losses do not, in themselves, constitute an obstacle to the use of electronic switches, since said electronic switches make it possible for bulk, mass, and prices to be significantly lower than the bulk, mass, and prices of matrices having mechanical type elements. However, it has been found that if each mechanical switch in a switch matrix of the mechanical type is replaced by an electronic switch, then when switching is performed to replace a faulty element with a spare element, the losses due to the matrix itself are generally not the same before and after switching.

To remedy that drawback, it is necessary to provide in each spare branch, a variable gain amplifier enabling the various amounts of attenuation to be compensated. However, that solution is difficult and expensive to implement.

OBJECTS AND SUMMARY OF THE INVENTION

To resolve that problem, the switch matrix of the invention includes a plurality of switch members of the electronic type which are mounted in such a manner that when an inlet of one outlet is switched to another outlet, the losses due to the electronic switch members passed through remain at substantially the same value.

It is thus not necessary to provide variable gain amplification to compensate the various losses between the paths passing through in the matrix, since it is the structure proper of said matrix which enables said compensation.

In an embodiment, in which each inlet is for connection to r outlets, each inlet is provided with a set of switch members associated so as to present one inlet and r outlets. In that case, it is preferable to provide, for each outlet a set of switch members mounted the opposite way round to the inlet members, said set having r inlets and one outlet; the sets associated with the outlets are preferably of structure analogous or identical (but symmetrical) to the structure of the sets associated with the inlets.

The switch members are, for example monolithic microwave integrated circuit (MMIC) technology switches with two or three outlets and presenting losses limited to about 1.5 dB.

The present invention provides a switch matrix having n inlets and p outlets, p being greater n, the matrix including a plurality of switch members each having one inlet and at least two outlets and each enabling a signal applied to the inlet of said member to be transferred to one of the outlets, each inlet of the matrix being for connection to one out of r outlets. The switch members are of the electronic type and are mounted in such as manner that when switching is performed consisting in modifying a connection from an inlet of the matrix to an outlet thereof, so that said same inlet is connected to another outlet of the matrix, the losses due to the switch members passed through remain at substantially the same value.

In an embodiment, the matrix comprises, for each inlet, a set of switch members associated so as to present one inlet and r outlets.

In an embodiment, the matrix comprises, for each outlet, a set of switch members having r inlets and one outlet, the sets associated with the outlets being mounted the opposite way round to the sets associated with the inlets.

In an embodiment, the sets associated with the outlets are of structure analogous to the structure of the sets associated with the inlets.

In an embodiment, the electronic switches are microwave range integrated circuits.

The present invention also provides use of a matrix in replacing a faulty electronic element connected to an outlet of the matrix, with another element connected to another outlet of the matrix.

BRIEF DESCRIPTION OF THE DRAWING

Other characteristics and advantages of the invention will appear on reading the description of various embodiments, given below with reference to the accompanying drawing, in which.

MORE DETAILED DESCRIPTION

Figure 1:
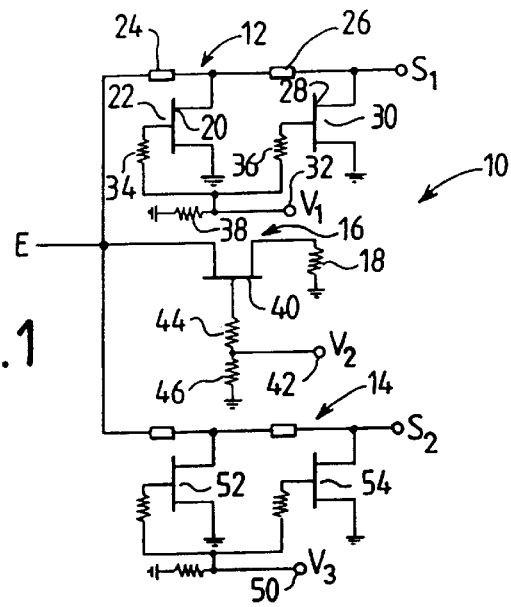
FIG. 1 is a circuit diagram of a switch member of the invention.
Figure 2:
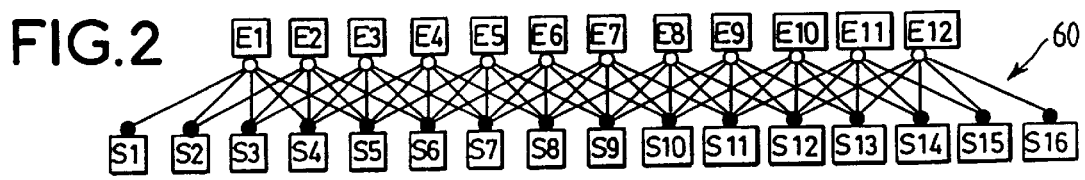
FIG. 2 is a diagram of a switch matrix having a plurality of switch members of the invention.

The switch member 10 shown in FIG. 1 is a switch member comprising a set of transistors that operate at microwave frequencies and made in MMIC technology, e.g. on a gallium arsenide substrate.

This switch member is for transmitting the signal on the inlet E either to the outlet $S_1$ or to the outlet $S_2$, but never to both outlets simultaneously. The member 10 comprises firstly two active branches 12 and 14, the branch 12 terminating in the outlet $S_1$ and the branch 14 terminating in the outlet $S_2$. In addition, the member 10 has a shunt branch 16 enabling the inlet E to be shunted to a load 18, e.g. of 50 Ω in the event of a loss of power to the switches of the member 10.

In the example, each of the branches 12 and 14 has two shunt transistors. Since the branches are identical, it suffices to describe one of them only, specifically the branch 12.

The inlet terminal E is connected to the drain 20 of a transistor 22 by a transmission line 24. The source of the transistor 22 is connected to ground.

The terminal 20 is also connected to the outlet $S_1$ via another transmission line 26.

The terminal common to the line 26 and to the outlet $S_1$ is connected to the drain 28 of a second transistor 30 whose source is likewise connected to ground.

The grids of the two transistors 22 and 30 are both connected to a bias terminal 32 via respective resistors 34 and 36. A DC bias voltage $V_1$ is applied to the terminal 32. The terminal common to the resistors 34 and 36 is also connected to ground via a resistor 38.

The shunt branch 16 comprises a transistor 40 whose source is connected to the inlet E and whose drain is connected to one end of the load resistor 18 whose other end is connected to ground. The grid of the transistor 40 is connected to a terminal 42 via a resistor 44. The point common to the terminal 42 and to the resistor 44 is connected to ground via another resistor 46.

A DC bias voltage $V_2$ is applied to the terminal 42.

Operation is as follows:

When the outlet $S_1$ is selected, i.e. when the inlet E is to be transferred to the outlet $S_1$, a voltage $V_1$ below the pinch-off voltage is applied to the terminal 32 so that each transistor presents practically infinite resistance; in this example, this voltage is equal to −2 volts. On terminal 42, for biasing the transistor 40 of the shunt branch 16, a voltage of −2 volts is also applied. Finally, the terminal 50 for biasing the transistors of the branch 14 has a voltage $V_3$ applied thereto equal to zero volts so that the channels of the transistors are conductive.

Under such conditions, the transistors 22 and 30 of the branch 12 constitute open circuits and therefore do not disturb transmission of the signal to the outlet $S_1$.

In contrast, applying zero volts to the terminal 50 of the branch 14 causes the corresponding transistors 52 and 54 to act as short circuits. It should be observed that in the microwave range, a short circuit means that the signal that is grounded is reflected back to the inlet E and is thus delivered to the outlet $S_1$.

Applying −2 volts to the terminal 42 for biasing the transistor 40 in the shunt branch 16 serves to keep this transistor in the open circuit state.

In the event of a loss of power, i.e. when the bias source(s) apply zero volts to all of the terminals 32, 42, and 50, or when these terminals are left disconnected (i.e. open circuit), then the transistors 22 & 30 and 52 & 54 in the active branches 12 and 14 are short circuits. Thus, these branches reflect signals back to the inlet E. However, in the event of such a failure, the transistor 40 presents low resistance and under such circumstances the signal applied to the inlet E is transferred to the load 18. Thus, electronic elements such as amplifiers and/or filters connected to the outlets $S_1$ and $S_2$ do not receive the input signal. The shunt branch 16 thus provides protection against losses of power to the switches.

In a variant, only a single transistor is provided in each active branch 12 or 14. Nevertheless, it is preferable to provide two or more transistors so as to improve shunting to ground when the branch is inactive. The resistance of a "short circuit" transistor is not zero and needs to be kept within limits.

A switch matrix 60 having twelve inlets $E_1$ to $E_{12}$ and sixteen outlets $S_1$ to $S_{16}$ is described below with reference to FIGS. 2 to 5. This matrix has a plurality of switch members of the type shown in FIG. 1.

Each inlet can be connected to five of the outlets. Thus, the inlet $E_1$ can be connected to any one of the outlets $S_1$, $S_2$, $S_3$, $S_4$, and $S_5$. However, on each occasion, the inlet $E_1$ is naturally connected to only one of those outlets. Similarly, the inlet $E_2$ can be connected to any one of the outlets $S_2$, $S_3$, $S_4$, $S_5$, and $S_6$, and so on up to the inlet $E_{12}$ which can be connected to any one of the outlets $S_{12}$, $S_{13}$, $S_{14}$, $S_{15}$, $S_{16}$. More generally, if the matrix has n inlets and p outlets, then each inlet can be connected to p-n+1 outlets.

If the inlet $E_1$ is connected to the outlet $S_1$ and the inlet $E_2$ is connected to the outlet $S_4$, and if the electronic element (not shown) connected to the outlet $S_1$ breaks down, it must be possible to replace it with a redundant element, for example the element connected to the outlet $S_2$. Under such conditions, the switch members of the matrix 60 are controlled in such a manner as to cause the inlet $E_1$ to cease to be connected to the outlet $S_1$, but instead to be connected to the outlet $S_2$.

Given that a switch member of electronic type presents losses that are significantly higher than a mechanical switch member, it is preferable to organize the matrix 60 in such a manner that on each modification to the connection, there is no modification to the losses. If there were to be modification to the losses, then it would be necessary to modify the gain of the amplifier that takes over from an amplifier that has broken down, and that would make implementation of the circuit significantly more complicated. An electronic member imparts loss of the order of 1.5 dB, whereas the corresponding loss for a mechanical switch member is of the order of 0.15 dB.

Figure 3:
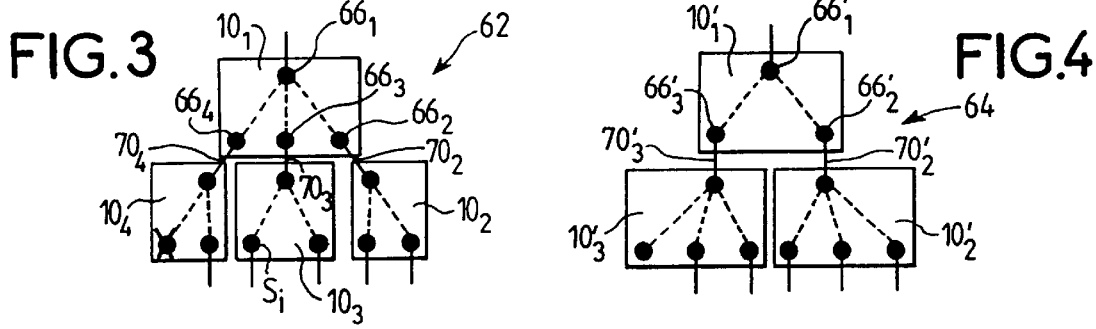
FIG. 3 shows a set or module of switch members of the invention.
Figure 4:
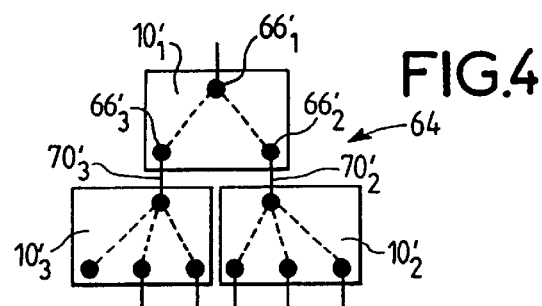
FIG. 4 is a figure analogous to that of FIG. 3, but for a variant.

To achieve the objective of maintaining losses in the event of a modification to the connection, the invention provides for switch members to be grouped together in sets or modules 62 as shown in FIG. 3 or 64 as shown in FIG. 4. In addition, all of the inlets $E_1$, $E_2$, etc. are associated with mutually identical sets, and all of the outlets $S_1$, $S_2$, etc. are associated with the same sets as explained below with reference to the example shown in FIG. 5.

FIGS. 3 and 4 relate to the case where the switch members can be of two kinds only, namely a first kind with one inlet and two outlets, and a second kind with one inlet and three outlets (not counting the shunt outlets). The sets 62 and 64 are intended for use with the example shown in FIG. 2; each of them thus has one inlet and five outlets.

The set 62 shown in FIG. 3 comprises firstly a switch member $10_1$ having one inlet $66_1$ and three outlets $66_2$, $66_3$, and $66_4$, and secondly three switch members $10_2$, $10_3$, and $10_4$ each having a single inlet and two outlets. Given that only five outlets are required, one of the switch members ($10_4$) has an outlet that is inactivated. The inlet of the member $10_2$ is connected via a conducting line $70_2$ to the outlet $66_2$ of switch member $10_1$. Similarly, the inlet of switch member $10_3$ is connected via a line $70_3$ to the outlet $66_3$ of the member $10_1$. Finally, the inlet of the member $10_4$ is connected to the outlet $66_4$ of the member $10_1$ by a conductor line $70_4$.

The set 64 shown in FIG. 4 comprises firstly a switch member $10'_1$ having one inlet $66'_1$ and two outlets $66'_2$ and $66'_3$, and secondly two switch members $10'_2$ and $10'_3$ each having one inlet and three outlets. Given that only five outlets are required in all as in the preceding example, one of the switch members, in this case the member referenced $10'_3$, has an outlet that is inactivated.

The inlet of member $10'_2$ is connected to the outlet $66'_2$ of the member $10'_1$ via a conductor line $70'_2$ and the inlet of the member $10'_3$ is connected to the outlet $66'_3$ of the member $10'_1$ via another conductor line $70'_3$.

The way a set 62 or 64 operates can be seen from its structure, and from the way each of the individual switch members operates as described above with reference to FIG. 1. For example, if the inlet $66_1$ (FIG. 3) of the set 62 is to be connected to the outlet $S_i$ of the member $10_3$, the member $10_1$ is caused to connect the inlet $66_1$ to the outlet $66_3$, and the member $10_3$ is caused to connect its inlet to the outlet $S_i$.

Figure 5:
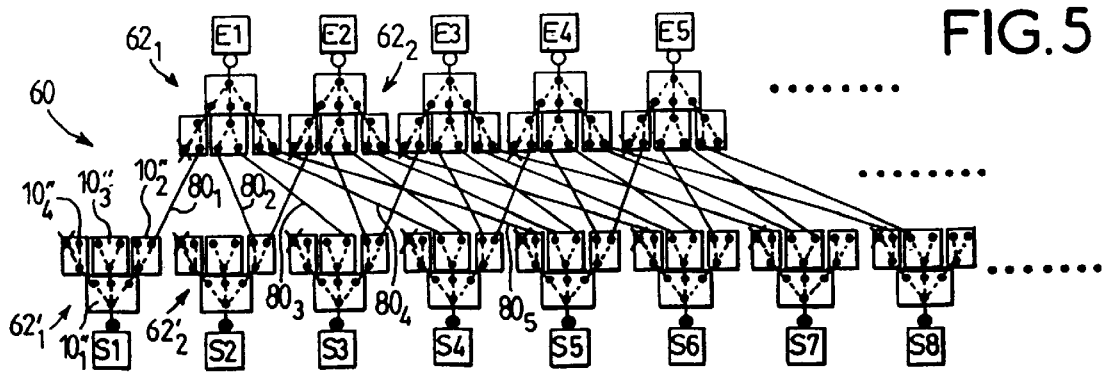
FIG. 5 shows a switch matrix comprising sets of switch modules of the type shown in FIG. 3.

In the example shown in FIG. 5, provision is made to associate one set 62 with each inlet terminal and with each outlet terminal. Thus, the inlet terminal $E_1$ is associated with a set $62_1$, the inlet terminal $E_2$ is associated with the set $62_2$, ... the outlet terminal $S_1$ is associated with the set $62'_1$, the outlet terminal $S_2$ is associated with the set $62'_2$, etc.

Naturally, the sets $62'_1$, $62'_2$, etc. are connected the opposite way round to the sets $62_1$, $62_2$, etc. More precisely, the members $10''_2$, $10''_3$, $10''_4$ of the set $62'_1$ comprise two inlets and one outlet, and the member $10''_1$ has three inlets and one outlet.

Finally, conductor lines $80_1$, $80_2$, $80_3$, $80_4$, $80^5$ are provided connecting each of the outlets of the set $62_1$ to one of the inlets of the sets $62'_1$, $62'_2$, ..., $62'_5$. In other words, the line $80_1$ connects an outlet from the set $62_1$ to one of the five inlets of the set $62'_1$, the line $80_2$ connects the second outlet of the set $62_1$ to one of the five inlets of the set $62'_2$, etc. It will be observed that only one of the inlets of the set $62'_1$ is connected to a conductor line, whereas the other sets $62'_2$, $62'_3$, $62'_4$, etc. have a larger number of conductor lines terminating at their inlets.

Whatever the connections made by the matrix, each time a signal on an inlet $E_i$ is applied to an outlet $S_j$, it always passes through the same types of element, specifically a switch member having one inlet and three outlets, a conductor line, a switch member having one inlet and two outlets, another conductor line $80_i$, a switch member having two inlets and one outlet, a conductor line, and finally a switch member having three inlets and one outlet. Under such conditions, losses will always be the same whatever the connection.

A switch matrix fitted with switch members of the invention presents size and mass that are considerably smaller than the size and mass of a matrix of mechanical switch elements, and this constitutes a decisive advantage for space applications. Finally, the price of such a matrix can be much smaller than the price of a matrix of mechanical switch members.

What is claimed is:

1. A switch matrix having n inlets and p outlets, p being greater n, the matrix including a plurality of switch members each having one inlet and at least two outlets and each enabling a signal applied to the inlet of said member to be transferred to one of the two outlets, each inlet of the matrix being for connection to one out of r outlets, wherein the switch members are microwave range integrated circuits and are mounted in such a manner that, when switching is performed consisting of modifying a connection from a first inlet of the matrix to first outlet thereof so that said first inlet is connected to a second outlet of the matrix, each transferred signal passes through the same number and type of switch members and circuit elements both before and after switching so that losses due to the switch members passed through by the transferred signal remain at substantially the same value before and after switching.

2. A matrix according to claim 1, comprising, for each inlet, a set of switch members associated so as to present one inlet and r outlets.

3. A matrix according to claim 2, comprising, for each outlet, a set of switch members having r inlets and one outlet, the sets associated with the outlets being mounted the opposite way round to the sets associated with the inlets.

4. A matrix according to claim 3, wherein the sets associated with the outlets are of structure analogous to the structure of the sets associated with the inlets.

5. Use of a matrix according to claim 1 enabling a faulty electronic element connected to an outlet of the matrix to be replaced by another element connected to another outlet of the matrix.

6. The switch matrix according to claim 1, wherein said matrix and said switch members are free of signal delay elements.

* * * * *